United States Patent
Abel

(10) Patent No.: US 10,982,335 B2
(45) Date of Patent: Apr. 20, 2021

(54) WET ATOMIC LAYER ETCHING USING SELF-LIMITING AND SOLUBILITY-LIMITED REACTIONS

(71) Applicant: Tokyo Electron Limited, Tokyo (JP)

(72) Inventor: Paul Abel, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/287,658

(22) Filed: Feb. 27, 2019

(65) Prior Publication Data

US 2020/0157693 A1 May 21, 2020

Related U.S. Application Data

(60) Provisional application No. 62/767,808, filed on Nov. 15, 2018.

(51) Int. Cl.
| | | |
|---|---|---|
| *C23F 1/26* | (2006.01) | |
| *H01L 21/3213* | (2006.01) | |
| *C23F 1/28* | (2006.01) | |
| *H01L 21/67* | (2006.01) | |

(52) U.S. Cl.
CPC .................. *C23F 1/26* (2013.01); *C23F 1/28* (2013.01); *H01L 21/32134* (2013.01); *H01L 21/67075* (2013.01)

(58) Field of Classification Search
CPC ...... C23F 1/26; C23F 1/28; C23F 1/02; C23F 1/12; H01L 21/32134; H01L 21/67069; H01L 21/67075; H01L 21/6708; H01L 21/67703; H01L 21/67739; C23C 22/02; C23C 22/77; C23C 22/83; C23G 1/10

USPC .... 216/17, 75, 102; 438/745, 750, 754, 758, 438/770
See application file for complete search history.

(56) References Cited

U.S. PATENT DOCUMENTS

| | | | | |
|---|---|---|---|---|
| 5,374,328 A | * | 12/1994 | Remba | H01L 29/66462 438/167 |
| 2002/0004303 A1 | * | 1/2002 | Agnello | H01L 21/28518 438/689 |
| 2003/0087528 A1 | | 5/2003 | Kruwinus et al. | |

(Continued)

FOREIGN PATENT DOCUMENTS

| | | |
|---|---|---|
| KR | 10-2017-0022922 A | 3/2017 |
| WO | 2018-004649 A1 | 1/2018 |

OTHER PUBLICATIONS

International Search Report issued in Application No. PCT/US2019/061678, dated Mar. 13, 2020 (8 pages).

*Primary Examiner* — Lan Vinh
(74) *Attorney, Agent, or Firm* — Rothwell, Figg, Ernst & Manbeck P.C.

(57) ABSTRACT

A method for improving both the microscopic and macroscopic uniformity of materials during etching is disclosed herein. These improvements may be accomplished through the formation and dissolution of thin, self-limiting layers on the material surface by the use of wet atomic layer etching (ALE) techniques. For etching of polycrystalline materials, these self-limiting reactions can be used to prevent this roughening of the surface during etching. Thus, as disclosed herein, a wet ALE process uses sequential, self-limiting reactions to first modify the surface layer of a material and then selectively remove the modified layer.

20 Claims, 6 Drawing Sheets

(56) References Cited

U.S. PATENT DOCUMENTS

| | | | |
|---|---|---|---|
| 2011/0094888 A1* | 4/2011 | Chen | C25D 5/02 |
| | | | 205/81 |
| 2012/0031768 A1* | 2/2012 | Reid | C25D 3/38 |
| | | | 205/123 |
| 2014/0370643 A1 | 12/2014 | Stern et al. | |
| 2018/0226278 A1 | 8/2018 | Arnepalli et al. | |
| 2018/0374936 A1* | 12/2018 | Kelly | H01L 29/0847 |

* cited by examiner

WET ATOMIC LAYER ETCHING USING SELF-LIMITING AND SOLUBILITY-LIMITED REACTIONS

This application claims priority to US Provisional Patent Application No. 62/767,808, entitled, "Wet Atomic Layer Etching Using Self-Limiting and Solubility-Limited Reactions" filed Nov. 15, 2018; the disclosure of which is expressly incorporated herein, in its entirety, by reference.

BACKGROUND

The present disclosure relates to the processing of substrates. In particular, it provides a method of etching of layers on substrates.

During substrate processing, a variety of techniques are known for etching various layers on a substrate. Plasma etching and wet etching are two well-known techniques. Wet etching involves dispensing a chemical solution over the surface of a substrate or immersing the substrate in the chemical solution. Often, the chemical solution contains a solvent, chemicals designed to react with materials on the substrate surface, and chemicals to promote dissolution of the reaction products. The result of exposure of the substrate surface to the etchant is the removal of material from the substrate. Etchant composition and temperature may control the etch rate, specificity, and residual material on the surface of the substrate post etch.

Thermodynamics and kinetics both play roles in etchant formulation. The desired reactions need to be both thermodynamically and kinetically favorable for a successful etch. The requirements for success become much more stringent for etching polycrystalline materials. For these materials, it is desirable that the removal rates for each individual crystallite facet and grain boundary geometry is substantially similar regardless or crystallite morphology or environment. Surface roughness plays an important role in interface quality and electrical properties of nanoscale features. When etching nanoscale polycrystalline materials, differing etch rates at grain boundaries compared to the different crystal facets leads to roughening of the surface during etching. Further, it is desirable that the material removal rate should be uniform at the macroscopic and microscopic levels and occurs at a rate that is compatible with high volume manufacturing. Macroscopic uniformity can be addressed with careful engineering, but microscopic uniformity depends on the chemistry of the etch itself.

As geometries of substrate structures continue to shrink and the types of structures evolve, the challenges of etching substrates have increased. One technique that has been utilized to address these challenges is atomic layer etching (ALE). ALE processes are generally known to involve processes which remove thin layers sequentially through one or more self-limiting reactions. For example, ALE typically refers to techniques that can etch with atomic precision—remove material one or a few monolayers at a time. In general, ALE schemes rely on a chemical modification of the surface to be etched followed by the selective removal of the modified layer. Thus, ALE processes offer improved performance by decoupling the etch process into sequential steps of surface modification and removal of the modified surface. Such processes often include multiple cyclic series of layer modification and etch steps. The modification step may modify the exposed surfaces and the etch step may selectively remove the modified layer. Thus, in one embodiment a series of self-limiting reactions may occur and the cycle may be repeatedly performed. In other embodiments, the process may use just one cycle. As used herein, an ALE process may also include quasi-ALE processes. In such processes, a series of modification and etch step cycles may still be used. However, the removal step may not be purely self-limiting as after removal of the modified layer, the etch substantially slows down, though it may not completely stop. Known ALE techniques have thus far been accomplished in vacuum, or in the gas phase. Such techniques utilize plasma or high-temperature thermochemical reactions to modify the material surface followed by chemical or ligand exchange reaction to volatilize the modified layer. The nature of ALE leads to smoothing of the surface as it is etched.

Other known sequential etching techniques include etching of III-V semiconductors using an oxygen plasma, ozone, or hydrogen peroxide as a self-limiting oxidation step and an acid wet etch to selectively remove the oxide. However, while the prior art provides a sequential etch process, it lacks atomic layer control due to the aggressive oxidants required.

Meeting microscopic and macroscopic etch uniformity requirements to an acceptable degree with known etch techniques has become increasingly difficult as the size of features being etched continues to decrease. Thus, it would be desirable to provide an improved etching process.

SUMMARY

A method for improving both the microscopic and macroscopic uniformity of materials during etching is disclosed herein. These improvements may be accomplished through the formation and dissolution of thin, self-limiting layers on the material surface by the use of wet ALE techniques. For etching of polycrystalline materials, these self-limiting reactions can be used to prevent this roughening of the surface during etching. Thus, as disclosed herein, a wet ALE process uses sequential, self-limiting reactions to first modify the surface layer of a material and then selectively remove the modified layer.

In one embodiment, a method of etching a substrate is provided. The method may comprise receiving the substrate, the substrate having a first material exposed, the first material comprising a polycrystalline material. The method further comprises selectively etching the polycrystalline material, the selectively etching including chemical modification of a surface of the polycrystalline material by exposing the surface to a chemical solution to provide a modified surface layer, and selective removal of the modified surface layer of the polycrystalline material by exposing the modified surface layer to a liquid-phase chemical solution.

In one embodiment, the chemical modification of the surface of the polycrystalline material includes oxidation of the polycrystalline material using an oxidizing agent. In one embodiment, the oxidizing agent includes an oxygen-containing gaseous environment, a chemical solution containing dissolved oxygen or other oxidizing agent, or a solvent—such as water—that directly participates in the oxidation of the surface. In another embodiment, the oxidizing agent is an oxygen-saturated chemical solution that includes oxygen dissolved in water, alcohol, or acetone.

In another embodiment, the chemical modification further includes passivation of the modified layer of the polycrystalline material using a complexing agent. In one embodiment, the complexing agent includes a citrate.

In another embodiment, the chemical modification further includes passivation of the modified layer in the polycrystalline material by exposing the substrate to citric acid. In another embodiment, the chemical modification includes exposing the substrate to molecular oxygen and a citrate.

In another embodiment, the method of etching the substrate described above further comprises rinsing the substrate with a solvent following the chemical modification, and preceding the selective removal.

In another embodiment of the methods of etching the substrate described above, the selective removal includes exposing the modified layer of the polycrystalline material to an aqueous solution to dissolve the modified layer.

In other embodiments, the methods of etching the substrate described are utilized wherein the chemical modification and the selective removal are sequentially and alternatingly performed. In some embodiments, the sequential steps of the chemical modification and the selective removal are (1) partially overlapped in time or (2) continuously performed. In some embodiments, the sequential steps of the chemical modification and the selective removal are not overlapped in time.

In yet further embodiments, prior to performing the selective etching described above, selectively dry etching the polycrystalline material by exposing the polycrystalline material to a gas-phase environment may be performed.

In one embodiment, the polycrystalline material may be a transition metal or may be a noble metal. In one preferred embodiment, the polycrystalline material is either ruthenium or cobalt.

In another embodiment, a method of etching a substrate is described. The method may comprise receiving the substrate with a first material composed of a polycrystalline material, and a second material composed of a different material, wherein an exposed surface of the polycrystalline material has a surface roughness characterized by a first surface roughness value. The method further comprises reducing the surface roughness to a second surface roughness value by exposing the substrate to a first wet chemical solution to chemically modify the polycrystalline material to create a chemically modified layer, followed by exposing the substrate to a second wet chemical solution to dissolve the chemically modified layer. In one embodiment, the polycrystalline material is a transition metal. In another embodiment, the chemical modification of the polycrystalline material includes oxidation of the polycrystalline material using an oxidizing agent. In yet another embodiment, the method further comprises etching the polycrystalline material on the substrate using a dry etching process, wherein the first surface roughness value is an outcome of the dry etching process.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
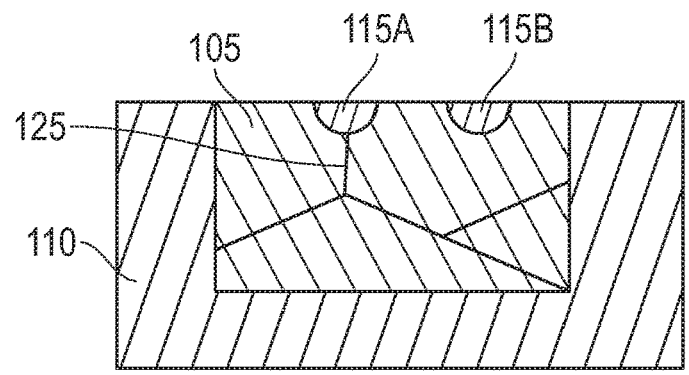
FIGS. 1A-1C illustrate a kinetic analysis of a polycrystalline metal etch.

A method for improving both the microscopic and macroscopic uniformity of materials during etching is disclosed herein. These improvements may be accomplished through the formation and dissolution of thin, self-limiting layers on the material surface by the use of wet ALE techniques. For etching of polycrystalline materials, these self-limiting reactions can be used to prevent roughening of the surface during etching. Thus, as disclosed herein, a wet ALE process uses sequential, self-limiting reactions to first modify the surface layer of a material and then selectively remove the modified layer.

As described herein, methods for implementing sequential, self-limiting reactions using wet chemical methods are provided. Using the wet ALE processes of the methods, surface reactions in the etch solutions are self-limiting, so the total etched amount may be integer multiples of the etch amount per cycle. For this reason, the method can also be referred to as a "digital etch." The techniques described herein may be utilized for a wide variety of materials that are known in the substrate processing art. Such materials may include polycrystalline materials. In one embodiment, the polycrystalline material may be a metal. In some embodiments, the metal may be a transition metal. In other embodiments, the metal is a noble material. In some specific embodiments, the metal may be comprised of ruthenium (Ru) or cobalt (Co).

In one embodiment, the wet etch technique described consists of sequentially exposing the substrate surface to two or more etchant solutions. The first etchant reacts with the surface of the substrate in a self-limiting fashion. The second etchant dissolves reaction products and exposes a fresh surface that is free to react with the first etchant in subsequent cycles. In contrast to dry ALE, which is a dry process relying on the volatility of reaction products, this wet etch ALE relies on the solubility of the reaction products for their removal. In order to be self-limiting, it is desirable for the surface reaction products to generally be insoluble in the first etchant. The reaction products are, however, readily soluble in the second etchant for material to be removed in the digital etch.

Additionally, the substrate surface to be removed reacts readily, and in a self-limiting fashion, with components of the first etchant, but does not react with the second etchant. The difference in substrate reactivity and product solubility can be accomplished with different chemical additives in a common solvent or with different solvents used for each of the two etchants.

The method described provides atomic layer control. The method can be generalized to any type of material to be etched using wet chemistries. The method can expand the role of solvent choice in passivation layer solubility. Further, complexing agents may be used as a method for controlling the solubility of reaction products.

The techniques described herein offer the opportunity of multiple advantages over other etch approaches. The techniques provide the benefits of ALE such as precise control of total etch amount, control of surface roughness, and improvements in wafer-scale uniformity. The techniques also provide several benefits of wet etching such as the simplicity of the etch chamber, atmospheric etching conditions, and speed at which it can be accomplished.

Wet ALE is accomplished by sequential exposure of a substrate surface to multiple etch etchants. Each etchant often comprises a solvent that may contain one or more of the following: chemical(s) that react with the substrate surface, chemical(s) that react with products formed on the substrate surface, chemical(s) that promote the dissolution of products formed on the substrate surface, or chemical(s) that promote cleaning of the substrate surface. The substrate may be rinsed with an inert solution between exposures to sequential etchants to prevent cross-contaminations of etchants. The substrate may also be exposed to gas-phase reactants between etchant exposures in order to drive additional chemistry.

An etchant in a wet ALE process will generally react with the substrate surface in a self-limited fashion. The etchant may react with the substrate surface to form a chemically modified layer on the substrate surface, it may react with the modified layer, it may dissolve the modified layer, or it may do some combination of these processes. Generally it is desirable that the etchant is selective and self-limiting. It is also desirable that the substrate surface can be affected by the etchant while underlying layers remain unchanged. The thickness of the self-limiting reaction is generally on the atomic scale. One monolayer is ideal though not required.

Exposure to a single etchant can be accomplished by a wide range of techniques, including by dipping the substrate in a bath, exposing the substrate to an aerosol spray, or dispensing the etchant onto the substrate in a spin chamber. In each case, it is preferably that the dose of etchant is sufficient to drive the reaction to its self-limiting value across the entire substrate surface.

The substrates utilized with the techniques disclosed herein may be any substrates for which the etching of material is desirable. For example, in one embodiment, the substrate may be a semiconductor substrate having one or more semiconductor processing layers (all of which together may comprise the substrate) formed thereon. In one embodiment, the substrate may be a substrate that has been subject to multiple semiconductor processing steps which yield a wide variety of structures and layers, all of which are known in the substrate processing art. In one embodiment, the substrate may be a semiconductor wafer including the various structures and layers formed.

As mentioned above, the techniques described herein may be used to etch a wide variety of materials. Such materials may include polycrystalline materials. Such materials may include metal, including but not limited to transition metals and noble metals. In one exemplary embodiment, the material to be etched may be a polycrystalline cobalt material. As provided below, the techniques described herein are described with relation to an etch of a polycrystalline cobalt material. However, it will be recognized by those skilled in the art that such an example is merely exemplary and other materials may be used.

Figure 1B:
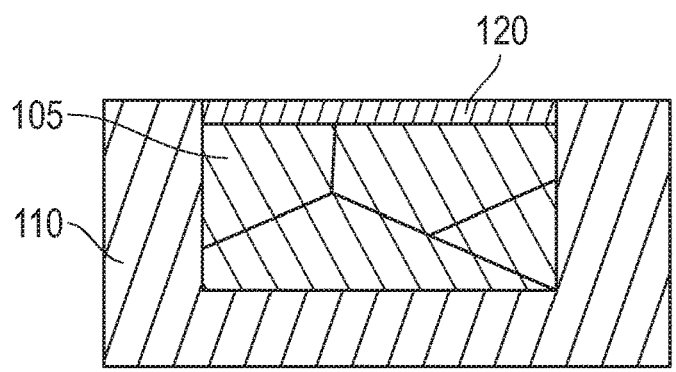
Figure 1C:
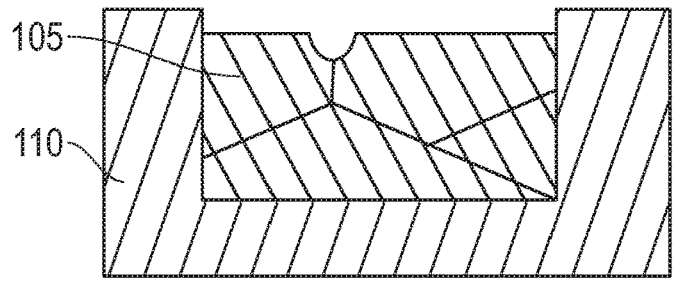

Many chemicals can etch polycrystalline cobalt, but controlling surface roughness during etching is difficult. Pitting and preferential etching at grain boundaries is difficult to prevent. Because zero valent cobalt is generally insoluble, it must first be oxidized. As used herein, oxidation of the cobalt refers to increasing formal charge of the cobalt. The oxidized species is then able to be dissolved into solution. Kinetic analysis of the generic two-step etch process (oxidation followed by dissolution) shows three relevant reaction rates: $K_{ox,b}$, the oxidation rate at grain boundaries, $K_{ox,g}$, the oxidation rate at grain surfaces, and $K_d$, the oxide dissolution rate. The relative rates of these reactions determines the post etch roughness. These reactions are presented in FIGS. 1A-1C which illustrates a kinetic analysis of a polycrystalline metal etch. As shown in FIGS. 1A-1C, a polycrystalline metal (to be etched), for example, cobalt 105 is surrounded by a dielectric 110 and oxidized metal regions 115A, 115B and 120 are formed on the top of the cobalt 105. As shown in FIG. 1A, oxidized metal region 115A is formed at a grain boundary 125 of the cobalt 105. An oxidized metal region 115B is formed on the grain surface. Equations 1 and 2 show the oxidation equations for oxidation at the grain surface and grain boundary, respectively.

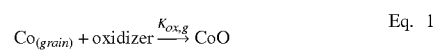

$$Co_{(grain)} + \text{oxidizer} \xrightarrow{K_{ox,g}} CoO \qquad \text{Eq. 1}$$

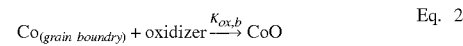

$$Co_{(grain\ boundry)} + \text{oxidizer} \xrightarrow{K_{ox,b}} CoO \qquad \text{Eq. 2}$$

Equation 3 shows an exemplary dissolution reaction of the cobalt oxide when utilizing citric acid in the reaction.

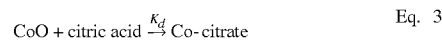

$$CoO + \text{citric acid} \xrightarrow{K_d} Co\text{-citrate} \qquad \text{Eq. 3}$$

If the $K_{ox,b}$, (the oxidation rate at grain boundaries) is greater than $K_{ox,g}$, (the oxidation rate at grain surfaces), then preferential oxidation may occur at grain boundaries. If the oxidation reaction rates ($K_{ox}$) are much greater than the dissolution reaction rate ($K_d$) then surface roughness increases may not occur such as shown in FIG. 1B (FIG. 1B illustrating the structure with oxidized metal region 120 being cobalt oxide on the structure surface). If the oxidation reaction rates ($K_{ox}$) are less than or equal to the dissolution reaction rate ($K_d$), then surface roughness may increase such as shown in FIG. 1C. In the equations above, the oxidized cobalt is presented as a cobalt oxide. However, the oxidized cobalt formed may be composed of cobalt oxides, cobalt hydroxides, cobalt oxyhydroxides, or some combination of these species.

Specifically, if oxidation is faster than dissolution, then the surface presented to the etch solution will be oxidized metal. The oxidized layer will continue to grow in thickness unless it is self-limited. If it is self-limited, then an oxidized layer of limited thickness will propagate down through the cobalt as the metal is etched. In this case, smooth etching will result because the oxidation rates at the grain boundaries and grain surfaces are not important—dissolution is the rate-determining step. If, however, dissolution is faster than oxidation, a metallic surface will be in contact with the etch solution because oxidized cobalt is dissolved into solution as fast as it is formed. This is the situation where the etch rate is controlled by oxidation kinetics, so faster oxidation rates at the grain boundaries lead to faster etching at the grain boundaries, pitting, and surface roughness increases.

As described below, the following is a method for temporally separating the oxidation and dissolution steps of the etch process. Each reaction is carried out in its own etch solution. The oxidation step is self-limiting, and the dissolution step is selective to remove only the oxidized metal. If these conditions are generally met, the total etch amount will be an integer multiple of the self-limiting oxide thickness. Such a process will provide a wet ALE process that leads to decreasing surface roughness as the etch progresses.

In order to provide an oxidation rate that is much faster than the dissolution rate, the oxidation step may be carried out with a solvent in which the oxidation products are insoluble. This allows the formation of a self-limiting oxidized layer without any material lost to dissolution. The oxidized surface can then be exposed to an etchant that will dissolve the oxidized layer without further oxidizing the surface. Complexing agents can be used to promote the solubility of the oxidized metal species. If these complexing agents are present in the oxidizing etchant, then a self-limiting metal complex is formed. If the etchant used for dissolution can dissolve the complex but not the oxidized metal, than the etchant can also be oxidizing, as the dissolution will still be self-limiting. There is also the possibility of complexing and dissolving with multiple etchants. For example, etchant 1 forms complex 1 on the surface. Etchant 2 dissolves complex 1 and forms complex 2 on the surface. Etchant 1 then dissolves complex 2 and continues the cycle by again forming complex 1. Such a technique may advantageously increase the etch rate per cycle.

For etching cobalt, in one embodiment, oxygen is used as the oxidizing agent and the complexing agent includes a citrate. In one embodiment, the oxidizing agent includes an oxygen containing gaseous environment or an oxygen saturated chemical solution. Exemplary oxygen saturated chemical solutions include, but are not limited to, oxygen dissolved in water, alcohol or acetone. In one embodiment, citric acid is used as the complexing agent. Citric acid reacts with cobalt oxide to form a species that is soluble in aqueous solution. The reaction between citric acid and cobalt oxide is also self-limiting. A single monolayer of product is formed when a cobalt oxide surface is exposed to citric acid. Citric acid will not react with metallic cobalt. Exposure to air or dissolved oxygen in solution forms a self-limiting native oxide layer on cobalt. The native oxide layer may be composed of cobalt oxides, cobalt hydroxides, cobalt oxyhydroxides, or some combination of these species. This accomplishes the oxidation portion of the wet ALE. Non-aqueous solvents such as acetone or isopropyl alcohol can be used for the complexation step. Cobalt citrate is insoluble in these solvents, so a monolayer of cobalt citrate is formed as a self-limiting passivation layer. A non-aqueous solution of citric acid can be used as an etch bath or be dispensed over the substrate surface in a spin chamber. During this step, a self-limiting cobalt citrate layer is formed. This reaction is fast and self-limiting. The oxidation and complexation step can be accomplished in the same solution if the solution contains both dissolved oxygen and citric acid. The etchant may contain both of these components because both reactions are self-limiting and there is no reaction between molecular oxygen and citric acid in solution.

Following the complexation step, a solvent rinse may be performed to remove excess citric acid solution without disturbing the self-limited cobalt complex. This rinse can be accomplished in a solvent bath or by dispensing the solvent over the substrate in a spin chamber. The solvent used for the complexation step can be used for the rinse step, but any solvent where the complexing agent is soluble but the metal complex is not soluble can be used. This rinse step prevents mixing of the oxidizing/complexing solution and the dissolution solution. A mix of these solutions can spontaneously etch cobalt. Forgoing the rinse step may allow spontaneous etching of cobalt and prevents many of the benefits of the digital etch.

Following complexation and solvent rinsing, aqueous solution is used to remove the cobalt citrate layer. Either the substrate can be immersed in a water bath, or water can be dispensed over the substrate surface in a spin chamber. Cobalt citrate is readily soluble in aqueous solution; however, cobalt oxide and metallic cobalt are not. This process is shown in the four steps of FIGS. 2A-2D which show one etch cycle.

Figure 2A:
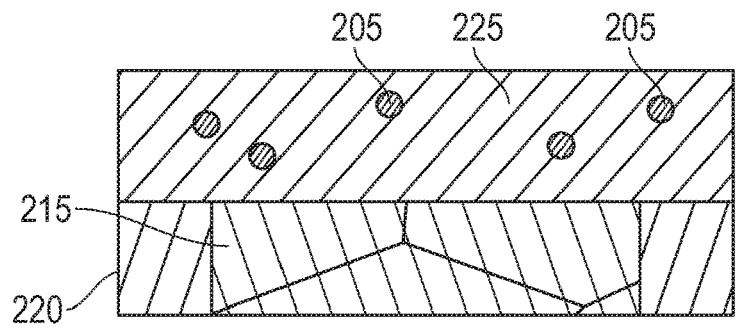
FIG. 2A-2D illustrate an exemplary etch cycle of an exemplary wet ALE metal etch.
Figure 2B:
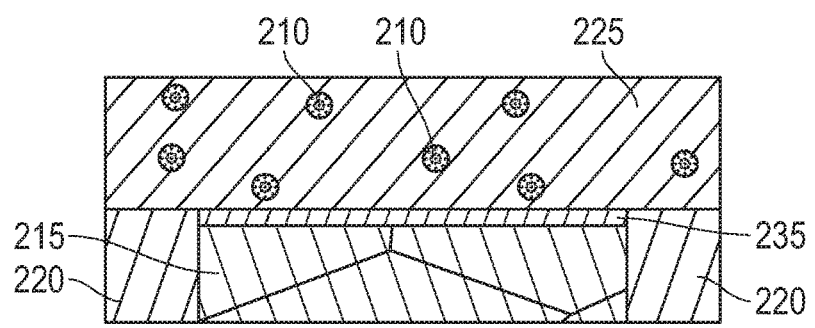
Figure 2C:
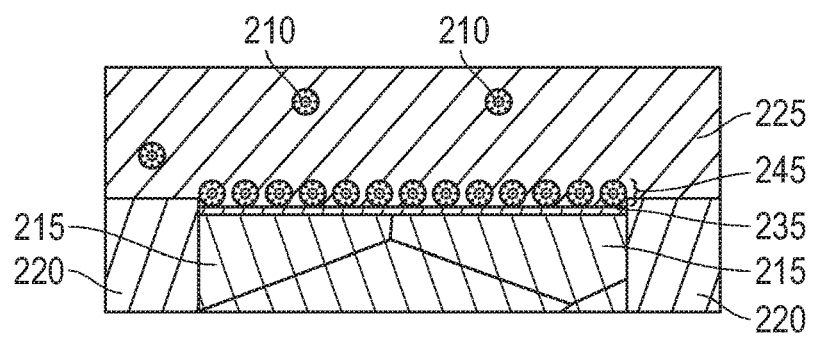
Figure 2D:
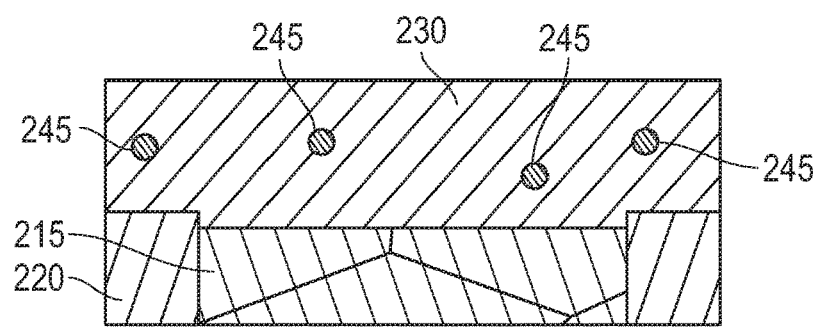

As shown in FIG. 2A, the first step of the etch cycle involves oxidizing the surface of the cobalt 215. As shown in FIG. 2A, cobalt 215 is embedded in a dielectric 220. The oxidation of the surface of the cobalt 215 may be accomplished by exposing the surface of cobalt 215 to atmosphere, an oxygen environment, or an oxygen-saturated solution of water, alcohol, acetone, or other solution. As shown in FIG. 2A, the cobalt 215 is exposed to oxygen 205 in acetone/isopropyl alcohol 225. As a result, a self-limiting cobalt oxide layer 235 is formed above cobalt 215 as shown in FIG. 2B. Then, the surface is then exposed to a non-aqueous citric acid solution as indicated by citrate 210 in FIG. 2B by citric acid being dissolved in either the acetone or isopropyl alcohol. A self-limiting cobalt-citrate complex 245 layer is formed on exposure to the cobalt oxide layer 235 as shown in FIG. 2C in which a portion of the cobalt oxide layer 235 has been consumed. Eventually, one or more cycles of complexing will consume the cobalt oxide layer 235. The self-limiting cobalt-citrate complex 245 layer is then removed by the water 230 of a water rinse as indicated by the cobalt-citrate complex 245 being removed into the solution as shown in FIG. 2D. It will be noted that the self-limiting rates of the oxide consumption/cobalt-citrate complex formation and the removal of the cobalt-citrate complex need not be the same. A solvent rinse may be required between the steps of FIG. 2C and 2D to prevent spontaneous etching if the two etch solutions mix. Further, various steps may be combined by oxygenating the solutions used in those steps, however generally the surface must be rinsed between the steps of FIG. 2D and FIG. 2B to prevent spontaneous etching that occurs when those solutions mix.

It will be recognized that the particular oxidizing, complexing and dissolution solutions are described above are merely exemplary. Thus a wide range of solutions may be utilized, as may be appropriate for the particular material being etched and the concepts described herein are not limited to the particular oxidizing, complexing and dissolution solutions being described. For example, oxidizers such as oxygen, ozone, water, nitrous oxide, or hydrogen peroxide, complexing agents such as citrate, acetate, carboxylate containing species, or amine containing species, and dissolution solutions such as Acetonitrile may be utilized.

Figure 3:
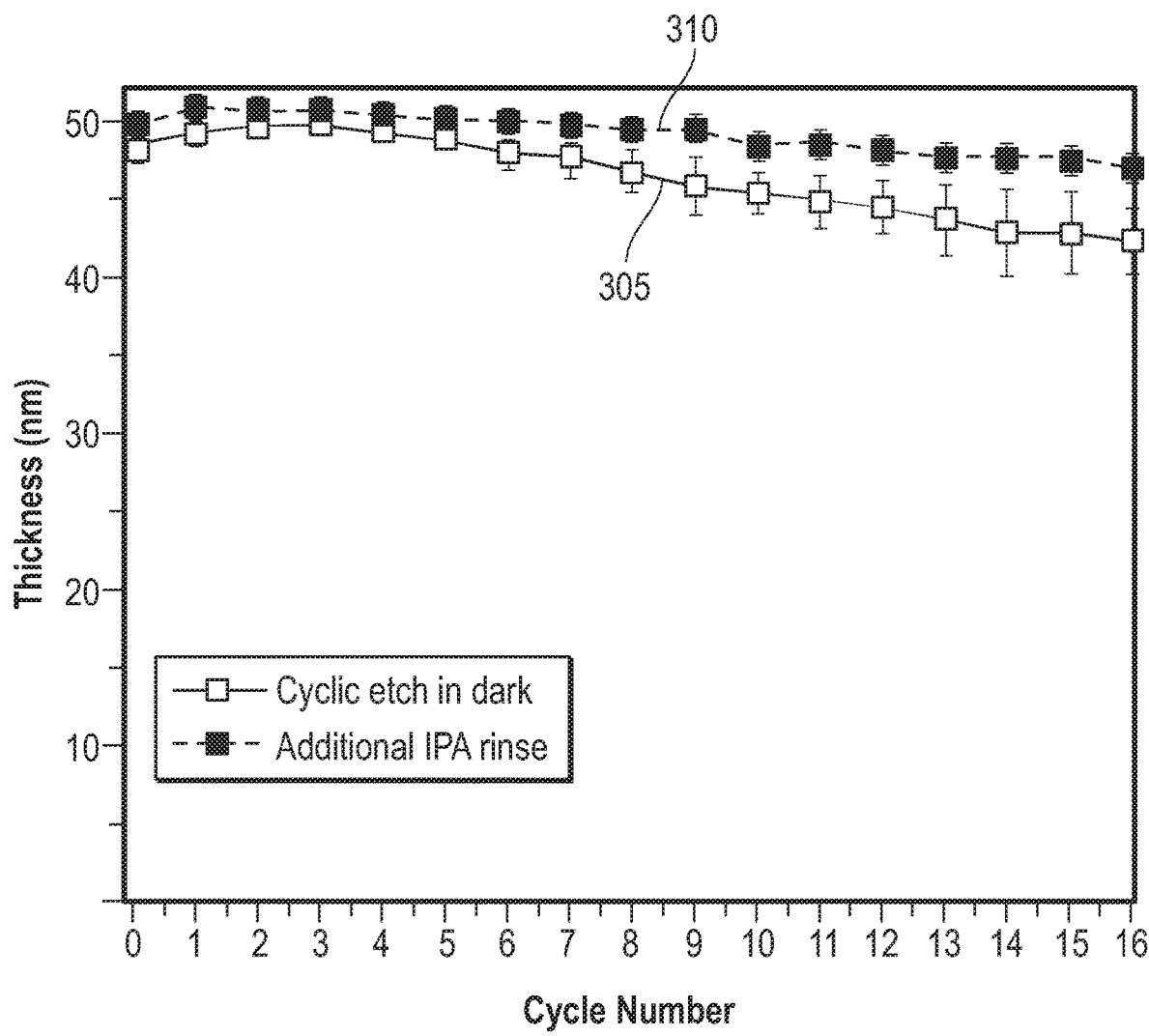
FIG. 3 illustrates the impact of a solvent rinse during an etch cycle such as shown in FIGS. 2A-2D.

The etch behavior of cobalt with and without the solvent rinse is shown in FIG. 3 which graphs thickness versus etch cycle numbers. Specifically, FIG. 3 illustrates the etch amount per cycle over multiple cycles of the process. With the solvent rinse, approximately 0.28 nm of cobalt is removed per etch cycle as shown by plot 310. This amount of etching is close to a single monolayer of cobalt. More than twice as much material, 0.6 nm of cobalt, is removed per etch cycle without the rinse step as shown in plot 305, indicating that spontaneous etching is occurring due to mixing of the etch solutions.

The self-limiting oxide thickness can be changed based on the solvent and oxidizer used. The self-limiting thickness of the metal complex layer can be changed by using different complexing agents. For molecular oxygen and citric acid, about 0.28 nm of cobalt is removed per etch cycle. Stronger oxidizers do not increase the amount of cobalt removed per etch cycle which suggests that the thickness of the cobalt citrate layer determines the etch rate per cycle.

There are multiple ways to structure the sequential etchant exposures to accomplish the same etch chemistry. An etchant containing dissolved oxygen or some other oxidizer and citric acid can be used to form a self-limiting cobalt citrate layer. Sequential exposure to an oxidizing etchant, either in solution or in the gas phase, followed by exposure to a citric acid containing etchant can be used instead. In both of these cases, the cobalt citrate layer is removed by a subsequent aqueous rinse. A third technique is to include the oxidizer in the aqueous rinse. The rinse removes the self-limited cobalt citrate layer as well as forms a self-limiting cobalt oxide layer. Subsequent exposure to a non-aqueous citric acid solution re-forms the self-limiting cobalt citrate layer for the next etch cycle.

Figure 4:
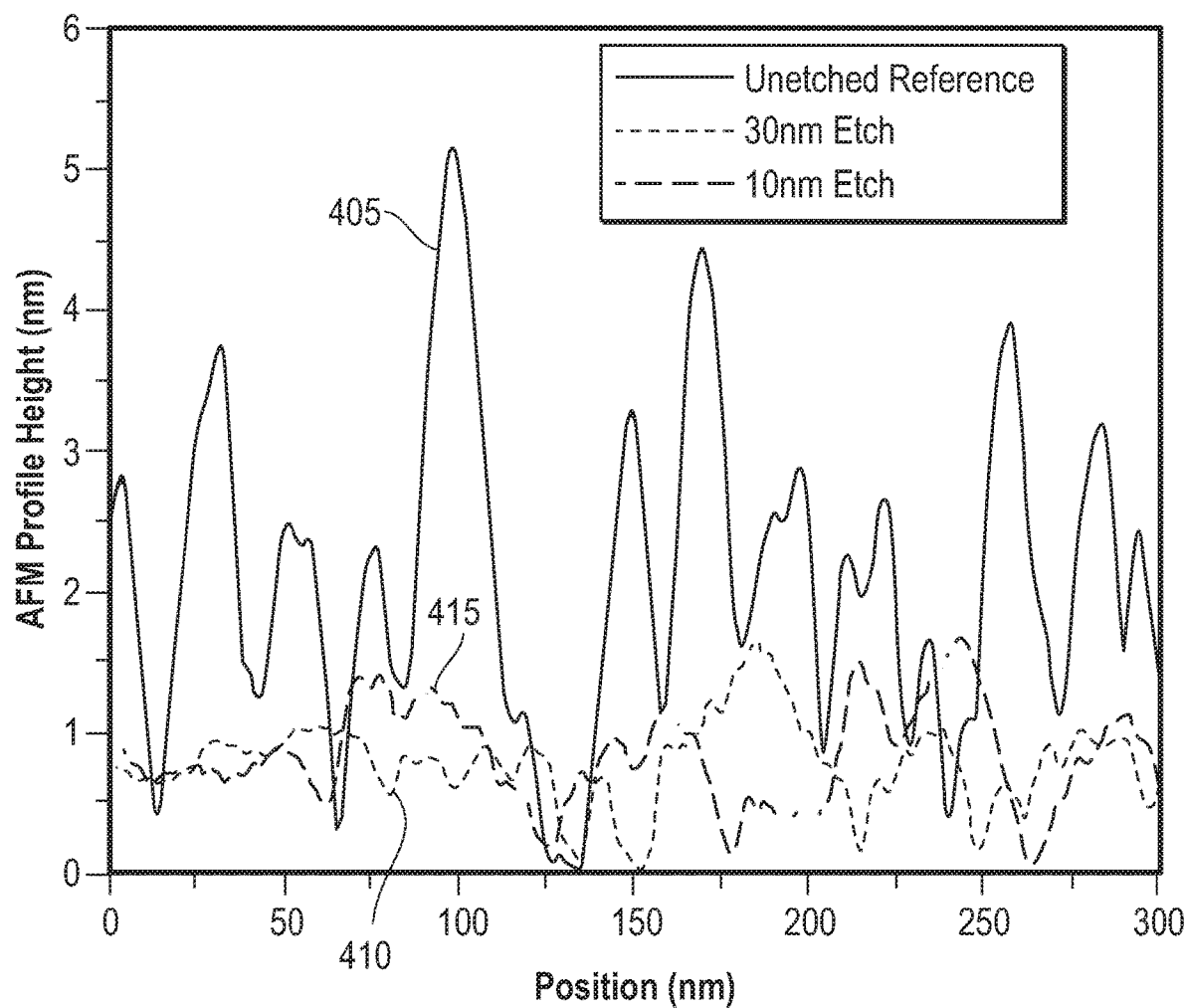
FIG. 4 illustrates the peak-to-peak roughness reduction which may occur in a wet ALE metal etch process.

The use of the disclosed etch chemistry decreases the surface roughness of cobalt films during etching. In one embodiment, the root mean square (RMS) roughness, as received, of the cobalt films was an RMS roughness of ~1.5 nm. This is reduced to ~0.6 nm after 10 nm of cobalt had been etched. This level of roughness is maintained for additional etching. The RMS roughness remains at ~0.6 nm after 30 nm of cobalt has been removed. The peak-to-peak roughness is also reduced as shown in FIG. 4 which graphs a profile height versus a substrate position. More specifically, FIG. 4 illustrates this peak-to-peak roughness of cobalt films after different amounts of wet ALE. The initial roughness of an unetched reference is shown as plot 405. This initial roughness of >5 nm is reduced to ~1.5 nm after only 10 nm of cobalt has been removed as shown by plot 415. This improvement is maintained for additional etching, as shown by plot 410 which illustrates 30 nm of cobalt etch.

Cobalt wet ALE can be carried out in a spin chamber where the substrate is rotated while etch solution is dispensed onto the substrate surface. The motion of the substrate distributes the etchant evenly over the substrate surface. The dispense time for each etchant must be long enough so that the self-limiting reaction thickness is achieved over the entire substrate surface. The chemical being dispensed can be switched between etch components to accomplish the digital etching. A rinse solution may be dispensed in between the complexation and dissolution solutions to prevent spontaneous etching of the cobalt during the transient mixing of the solutions in the transition between them. A single etch cycle, defined by oxidation/complexation followed by dissolution of the complex, can be repeated until an appropriate amount of material is removed.

It will be recognized, that the use of a spin chamber is merely one embodiment and a wide variety of differing process tools may be used to perform the techniques described herein. As an alternative, for example, the substrate could be dipped in chemical baths containing the etchants. The substrate can be sequentially immersed in a baths of each etchant in order with intermediate rinse baths to prevent cross contamination of the chemicals. This process can be repeated until an appropriate amount of material is removed. In yet another embodiment, the process may be utilized with aerosol sprays, fogs or mists of each reactant. Further, it will be recognized that a combination of the various described tools for applying the reactants may be used, even within one cycle of the process.

Thus, as described herein, techniques are provided for etching layers in which self-limiting processes are utilized to provide smooth layers. One application of such a technique may be for etching metal surfaces for a recess etch for fully self-aligned vias. In such applications, metal-filled trenches in a dielectric material must be selectively etched without increasing the surface roughness of the metal. It will be recognized that such an application is merely exemplary and the techniques described herein may be used for many other applications.

In one embodiment, the wet etching techniques described herein may also be combined with dry etching techniques, such as plasma etching. For example, in one embodiment, prior to performing the selective wet etching, selectively dry etching the polycrystalline material may be accomplished first by exposing the polycrystalline material to a gas-phase environment. Then the wet etching techniques described herein may be performed. In this manner, a combination of dry and wet processing may be achieved, with the wet processing providing the wet ALE benefits described herein. Thus, for example, the wet etching may be utilized to reduce the surface roughness that exists after the dry etching process.

Figure 5:
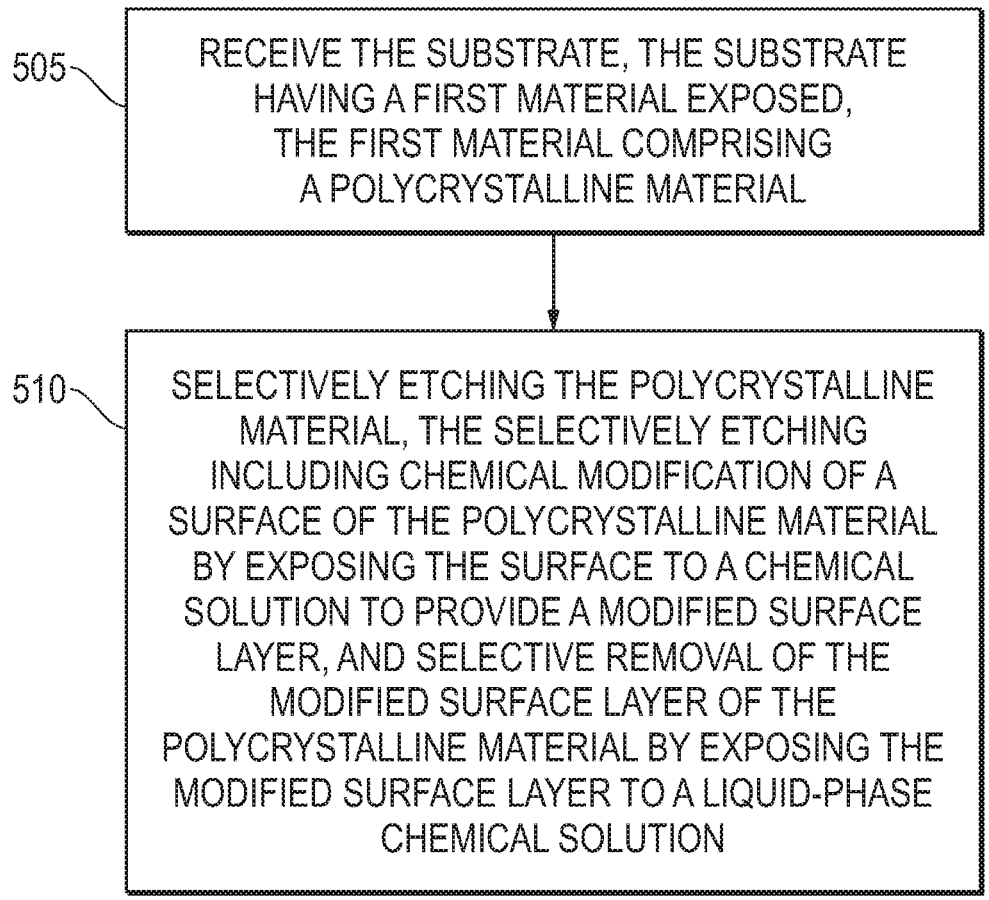
FIGS. 5 and 6 demonstrate exemplary methods for processing a substrate according to the techniques described herein.
Figure 6:
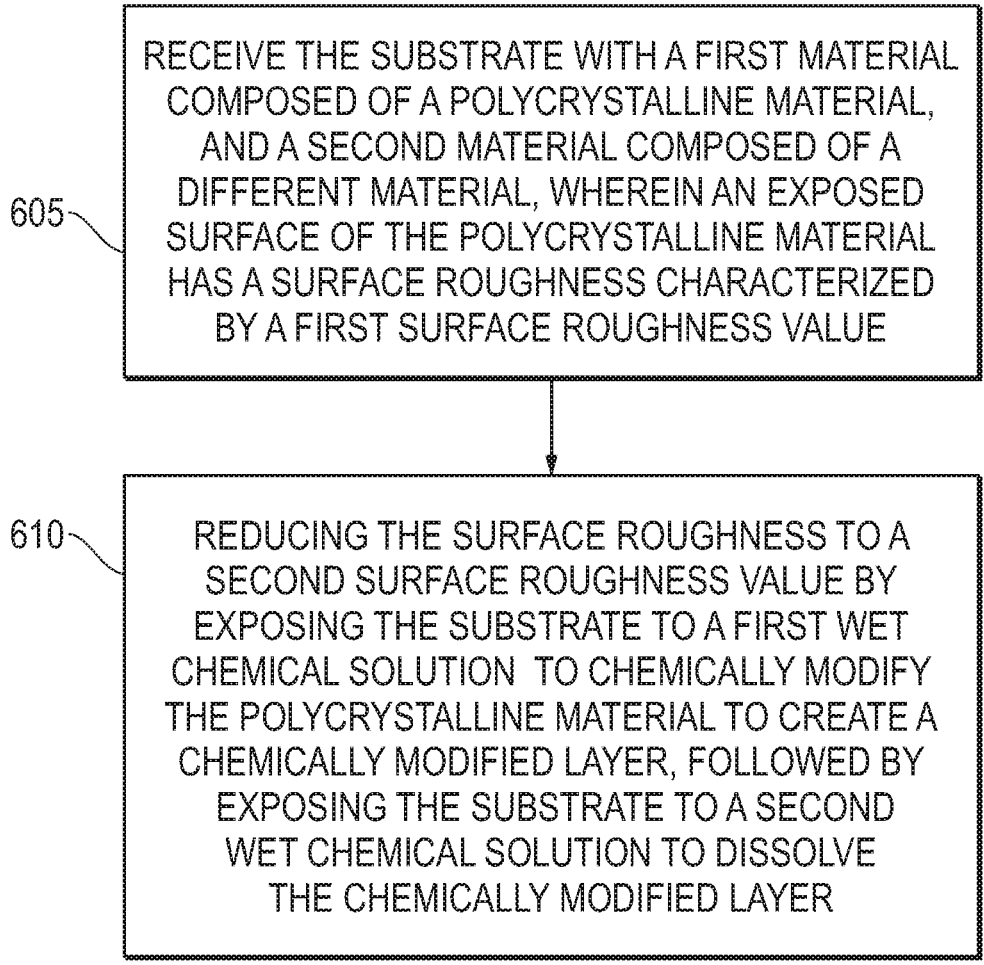

FIGS. 5-6 illustrate exemplary methods for use of the processing techniques described herein. It will be recognized that the embodiments of FIGS. 5-6 are merely exemplary and additional methods may utilize the techniques described herein. Further, additional processing steps may be added to the methods shown in the FIGS. 5-6 as the steps described are not intended to be exclusive. Moreover, the order of the steps is not limited to the order shown in the figures as different orders may occur and/or various steps may be performed in combination or at the same time.

FIG. 5 illustrates a method for etching a substrate. The method comprises step 505 of receiving the substrate, the substrate having a first material exposed, the first material comprising a polycrystalline material. Then, the method includes a step 510 of selectively etching the polycrystalline material, the selectively etching including chemical modification of a surface of the polycrystalline material by exposing the surface to a chemical solution to provide a modified surface layer, and selective removal of the modified surface layer of the polycrystalline material by exposing the modified surface layer to a liquid-phase chemical solution.

FIG. 6 illustrates a method for etching a substrate. The method comprises step 605 of receiving the substrate with a first material composed of a polycrystalline material, and a second material composed of a different material, wherein an exposed surface of the polycrystalline material has a surface roughness characterized by a first surface roughness value. The method then includes step 610 of reducing the surface roughness to a second surface roughness value by exposing the substrate to a first wet chemical solution to chemically modify the polycrystalline material to create a chemically modified layer, followed by exposing the substrate to a second wet chemical solution to dissolve the chemically modified layer.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A method of etching a substrate, comprising:
receiving the substrate, the substrate having a first material exposed, the first material comprising a polycrystalline material; and
selectively etching the polycrystalline material, the selectively etching including chemical modification of a surface of the polycrystalline material by exposing the surface to a chemical solution to provide a modified surface layer, and selective removal of the modified surface layer of the polycrystalline material by exposing the modified surface layer to a liquid-phase chemical solution;
wherein:
the polycrystalline material has a first portion and a second portion,
the first portion of the polycrystalline material corresponds to a top portion of the substrate,
the modified surface layer corresponds to the first portion of the polycrystalline material, and
the selective removal of the modified surface layer corresponds to removing the top portion of the substrate.

2. The method of claim 1, wherein the polycrystalline material is a transition metal.

3. The method of claim 1, wherein the polycrystalline material comprises ruthenium (Ru) or cobalt (Co).

4. The method of claim 1, wherein the chemical modification of the surface of the polycrystalline material includes oxidation of the polycrystalline material using an oxidizing agent.

5. The method of claim 4, wherein the oxidizing agent includes an oxygen-containing gaseous environment, or an oxygen-saturated chemical solution.

6. The method of claim 4, wherein the oxidizing agent is an oxygen-saturated chemical solution that includes oxygen dissolved in water, alcohol, or acetone.

7. The method of claim 4, wherein the chemical modification further includes passivation of the modified surface layer in the polycrystalline material by exposing the substrate to citric acid.

8. The method of claim 4, wherein the chemical modification includes exposing the substrate to molecular oxygen and a citrate.

9. The method of claim 4, further comprising rinsing the substrate with a solvent following the chemical modification, and preceding the selective removal.

10. The method of claim 4, wherein the selective removal includes exposing the modified surface layer of the polycrystalline material to an aqueous solution to dissolve the modified layer.

11. The method of claim 4, wherein the chemical modification further includes passivation of the modified surface layer of the polycrystalline material using a complexing agent.

12. The method of claim 11, wherein the complexing agent includes a citrate.

13. The method of claim 1, further comprising, prior to performing the selective etching, selectively dry etching the polycrystalline material by exposing the polycrystalline material to a gas-phase environment.

14. The method of claim 1, wherein the chemical modification and the selective removal are sequentially and alternatingly performed.

15. The method of claim 14, wherein sequential steps of the chemical modification and the selective removal are (1) partially overlapped in time or (2) continuously performed.

16. The method of claim 14, wherein sequential steps of the chemical modification and the selective removal are not overlapped in time.

17. The method of claim 1, wherein:
the substrate further includes a second material composed of a different material than the first material, wherein the polycrystalline material has a surface roughness characterized by a first surface roughness value; and
the selectively etching includes reducing the surface roughness to a second surface roughness value by exposing the substrate to the chemical solution as a first wet chemical solution which chemically modifies the polycrystalline material to form the modified surface layer, followed by exposing the substrate to the liquid-phase chemical solution as a second wet chemical solution to dissolve the modified surface layer.

18. The method of claim 17, wherein the polycrystalline material is a transition metal.

19. The method of claim 17 wherein chemical modification of the polycrystalline material includes oxidation of the polycrystalline material using an oxidizing agent.

20. The method of claim 17, further comprising etching the polycrystalline material on the substrate using a dry etching process, wherein the first surface roughness value is an outcome of the dry etching process.

* * * * *